(12) United States Patent
Chang et al.

(10) Patent No.: US 9,177,792 B2
(45) Date of Patent: Nov. 3, 2015

(54) REVERSE TONE STI FORMATION AND EPITAXIAL GROWTH OF SEMICONDUCTOR BETWEEN STI REGIONS

(71) Applicant: Taiwan Semiconductor Manufacturing Company, Ltd., Hsin-Chu (TW)

(72) Inventors: Kai-Tai Chang, Kaohsiung (TW); Yi-Shan Chen, Tainan (TW); Hsin-Chih Chen, Tucheng (TW); Chih-Hsin Ko, Fongshan (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 36 days.

(21) Appl. No.: 14/103,346

(22) Filed: Dec. 11, 2013

(65) Prior Publication Data

US 2014/0099771 A1    Apr. 10, 2014

Related U.S. Application Data

(62) Division of application No. 13/298,112, filed on Nov. 16, 2011, now Pat. No. 8,629,040.

(51) Int. Cl.
*H01L 21/02* (2006.01)
*H01L 21/033* (2006.01)
*H01L 21/762* (2006.01)

(52) U.S. Cl.
CPC .... *H01L 21/02653* (2013.01); *H01L 21/02639* (2013.01); *H01L 21/0337* (2013.01); *H01L 21/76224* (2013.01); *H01L 21/76229* (2013.01)

(58) Field of Classification Search
CPC ............... H01L 21/02639; H01L 21/0337; H01L 21/76224
See application file for complete search history.

(56) References Cited

U.S. PATENT DOCUMENTS

| | | | |
|---|---|---|---|
| 4,549,926 A * | 10/1985 | Corboy et al. | 438/412 |
| 7,132,331 B2 | 11/2006 | Jang et al. | |
| 7,390,746 B2 | 6/2008 | Bai et al. | |
| 7,611,980 B2 | 11/2009 | Wells et al. | |
| 7,795,149 B2 | 9/2010 | Sandhu | |
| 8,048,813 B2 | 11/2011 | Lai et al. | |
| 8,728,906 B2 | 5/2014 | Chang et al. | |
| 2003/0104700 A1* | 6/2003 | Fleming et al. | 438/694 |
| 2007/0161251 A1 | 7/2007 | Tran et al. | |
| 2013/0069160 A1 | 3/2013 | Aquilino et al. | |

FOREIGN PATENT DOCUMENTS

| | | |
|---|---|---|
| CN | 1630058 | 6/2005 |
| CN | 101164147 | 4/2008 |
| KR | 1020020002943 A | 1/2002 |
| KR | 1020070001509 A | 1/2007 |

* cited by examiner

*Primary Examiner* — Thanh V Pham
(74) *Attorney, Agent, or Firm* — Slater & Matsil, L.L.P.

(57) ABSTRACT

A method includes forming a hard mask over a substrate, patterning the hard mask to form a first plurality of trenches, and filling a dielectric material into the first plurality of trenches to form a plurality of dielectric regions. The hard mask is removed from between the plurality of dielectric regions, wherein a second plurality of trenches is left by the removed hard mask. An epitaxy step is performed to grow a semiconductor material in the second plurality of trenches.

20 Claims, 13 Drawing Sheets

REVERSE TONE STI FORMATION AND EPITAXIAL GROWTH OF SEMICONDUCTOR BETWEEN STI REGIONS

This application is a divisional of U.S. patent application Ser. No. 13/298,112, entitled "Methods for Epitaxially Growing Active Regions between STI Regions," filed on Nov. 16, 2011, which application is incorporated herein by reference.

BACKGROUND

In the formation of integrated circuits, Shallow Trench Isolation (STI) regions are used in semiconductor wafers to define active regions. Integrated circuit devices such as transistors may then be formed at the surfaces of the active regions.

In the existing STI formation processes, the STI regions are formed by forming trenches in a silicon substrate first. The formation of the trenches includes forming a pad oxide layer over the silicon substrate, and forming a silicon nitride layer over the pad oxide layer. The silicon nitride layer, the pad oxide layer, and the silicon substrate are then etched to form the trenches. The trenches are filled with a dielectric material. A Chemical Mechanical Polish (CMP) is then performed to remove excess dielectric material that is over the silicon nitride layer. The portions of the dielectric material left in the silicon substrate thus form STI regions. The portions of the silicon substrate between the STI regions are the active regions. The remaining silicon nitride layer and the pad oxide layer are then removed. It has been found that in certain processes, such as in double-patterning processes, the thicknesses of the STI regions are not uniform. Large STI regions and small STI regions may have a significant difference in thicknesses.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Methods for forming isolation regions in semiconductor substrates and active regions between isolation regions are provided. The intermediate stages of manufacturing the isolation regions and the active regions are illustrated in accordance with embodiments. Variations of the embodiments are then discussed. Throughout the various views and illustrative embodiments, like reference numbers are used to designate like elements.

Figure 1:
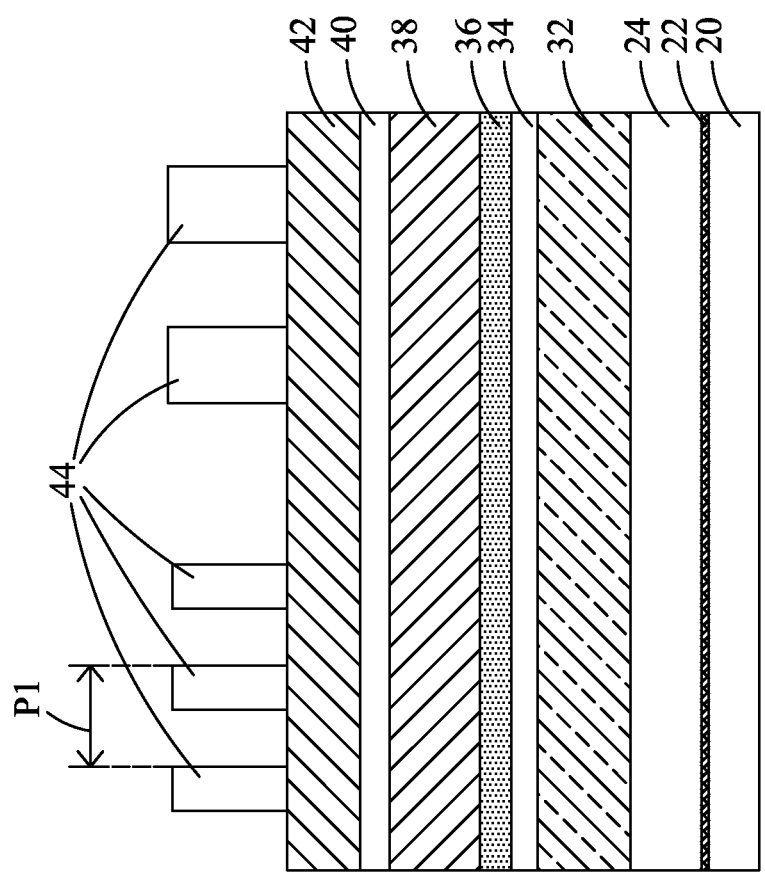
FIGS. 1 through 13 are cross-sectional views of intermediate stages in the manufacturing of Shallow Trench Isolation (STI) regions and active regions in accordance with various embodiments.

FIGS. 1 through 13 illustrate cross-sectional views of intermediate stages in the formation of active regions and isolation regions in accordance with various embodiments. FIG. 1 illustrates a structure including substrate 20 and overlying layers. Substrate 20 may be formed of a semiconductor material such as silicon, silicon germanium, or the like, and may be a bulk substrate or a semiconductor-on-insulator (SOI) substrate. In some embodiments, substrate 20 is a crystalline semiconductor substrate such as a crystalline silicon substrate. Pad oxide layer 22 and hard mask 24 are formed over substrate 20. In accordance with embodiments, pad oxide layer 22 comprises silicon oxide. Hard mask 24 may be formed of silicon nitride, polysilicon, or the like. The thickness of pad oxide layer 22 may be between about 50 Å and 150 Å. The thickness of hard mask 24 may be greater than about 0.07 µm. In some embodiments, the combined thickness of hard mask 24 and pad oxide layer 22 may be selected to be substantially equal to, or greater than, the desirable thickness T2 of isolation regions (STI regions) 65 in FIG. 12.

Hard mask 32 is formed over substrate hard mask 24. Hard mask 32 may comprise an Ashing Removable Dielectric (ARD) material, and hence is referred to as ARD 32 hereinafter, although it may also be formed of other materials. In some embodiments, ARD 32 includes amorphous carbon. Plasma enhanced (PE) oxide 34, which may be a silicon oxide formed using Plasma Enhanced Chemical Vapor Deposition (PECVD), is formed over, and may adjoin, ARD 32. In some embodiments, silicon oxynitride layer 36 is formed over PE oxide 34. PE oxide 34 and silicon oxynitride layer 36 may be used for lithographic purposes, for example, for reducing the reflection of the yellow light used in the exposure of the overlying photo resist. It is appreciated that layer 34 and/or layer 36 may also be formed of other materials.

ARD 38, silicon oxynitride layer 40, and bottom anti-reflective coating (BARC) 42 may be formed over silicon oxynitride layer 36. ARD 38 may be formed of the same material as ARD 32. Throughout description, ARD 38 is alternatively referred to as a mandrel layer since it is used for forming mandrels 46 (not shown in FIG. 1, please refer to FIG. 2). Layers 38, 40, and 42 may be replaced by other materials, and the number of layers may also be different from what is shown in FIG. 1.

Figure 2:
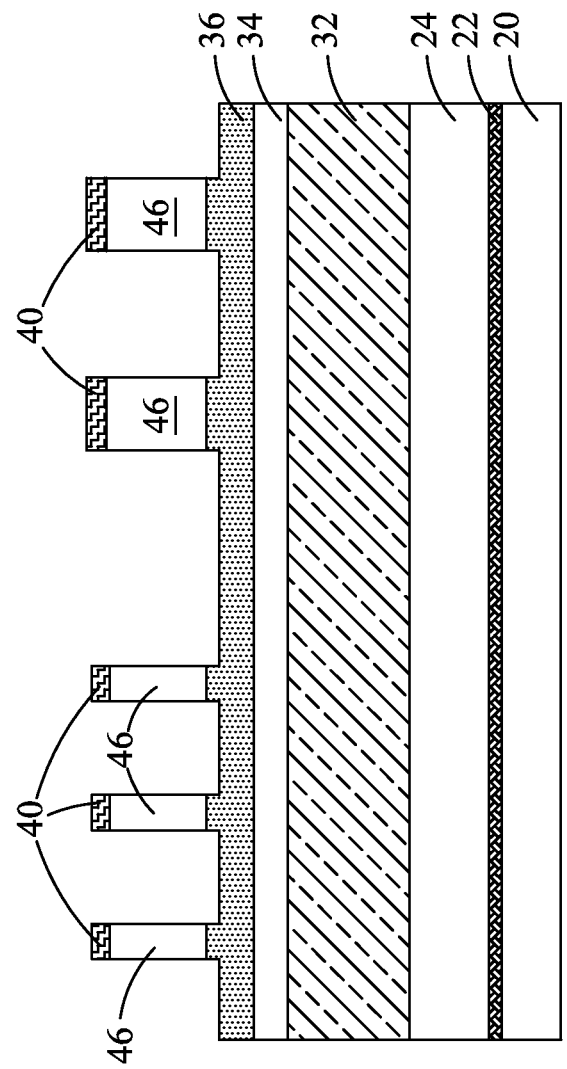

FIGS. 1 and 2 also illustrate a first lithography process for patterning ARD 38. Photo resist 44 is formed over BARC 42, and is then patterned. Layers 38, 40, 42, and 44 are used to form patterns with small pitches, which may be less than the minimum pitch allowed by the lithography process used for forming the integrated circuits. Layers 32, 34, and 36 are used to transfer the small pitches to substrate 20. In some embodiments, the minimum pitch P1 of photo resist 44 may be close to, or equal to, the minimum pitch allowed by the technology for forming photo resist 44 and for performing the etch using photo resist 44 as an etching mask.

As illustrated in FIG. 2, BARC 42, silicon oxynitride layer 40, and ARD 38 are etched, for example, using plasma-assisted dry etching, followed by the removal of photo resist 44 and BARC 42. The remaining portions of 38 are referred to as mandrels 46 hereinafter. In the resulting structure, leftover portions of silicon oxynitride layer 40 may remain on top of mandrels 46. The minimum pitch of mandrels 46 may be substantially equal to minimum pitch P1 of photo resist 44 (FIG. 1).

Figure 3:
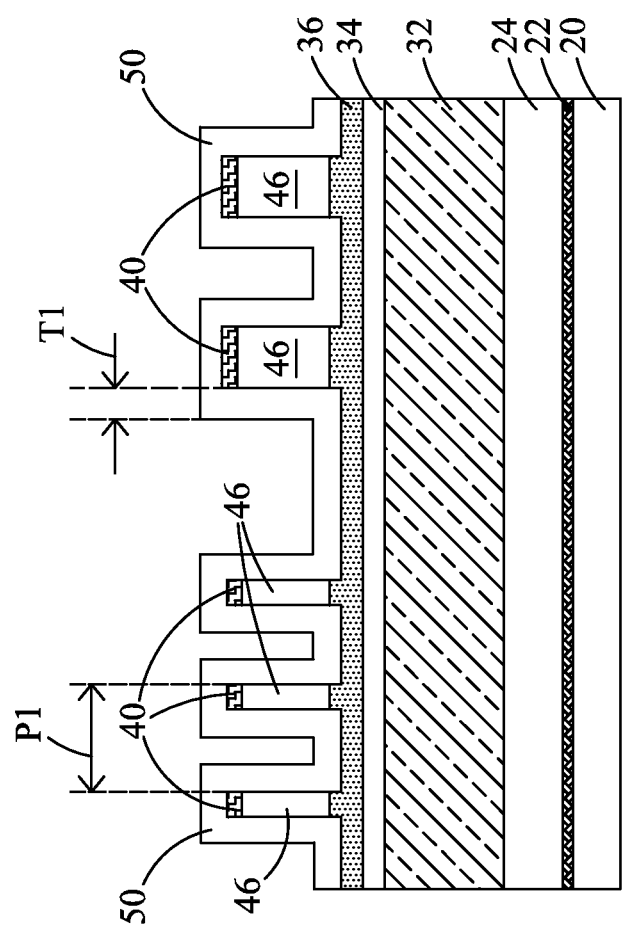

Next, as shown in FIG. 3, spacer layer 50 is deposited using a conformal deposition method. In some embodiments, spacer layer 50 is deposited using Atomic Layer Deposition (ALD), which may form a high quality film that has a low etching rate. The ALD may be performed using DiChloroSilane (DCS) and ammonia as precursors, and the resulting spacer layer 50 may include silicon nitride or silicon-rich nitride. In alternative embodiments, other conformal deposition methods, such as Low-Pressure Chemical Vapor Deposition (LPCVD), may be performed. Thickness T1 of spacer layer 50 may be less than a half of, and may be close to about a third of, pitch P1 of mandrels 46.

Figure 4:
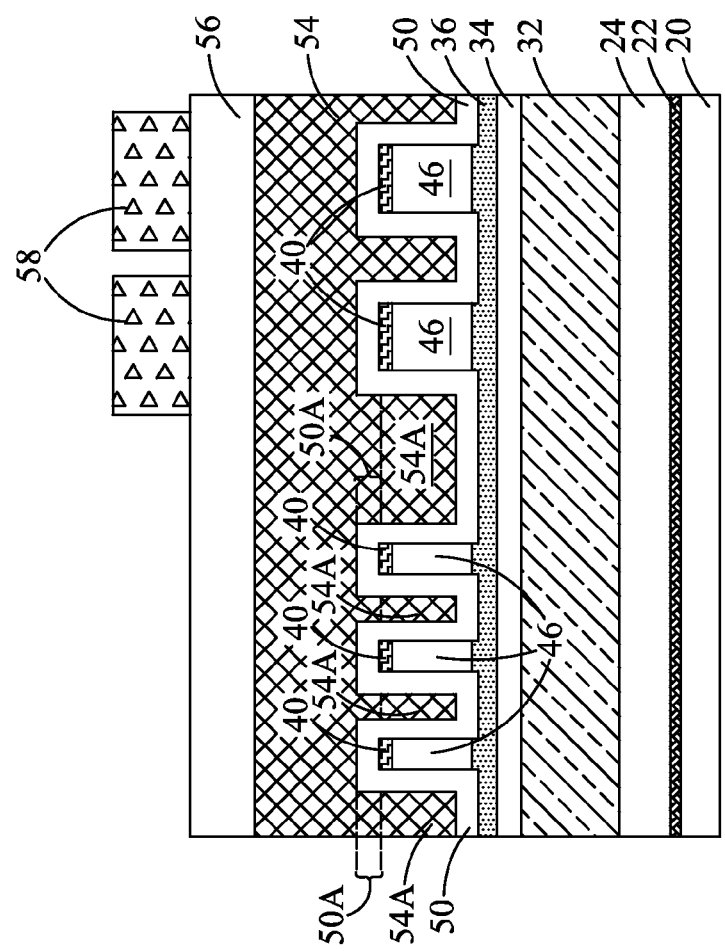
Figure 5:
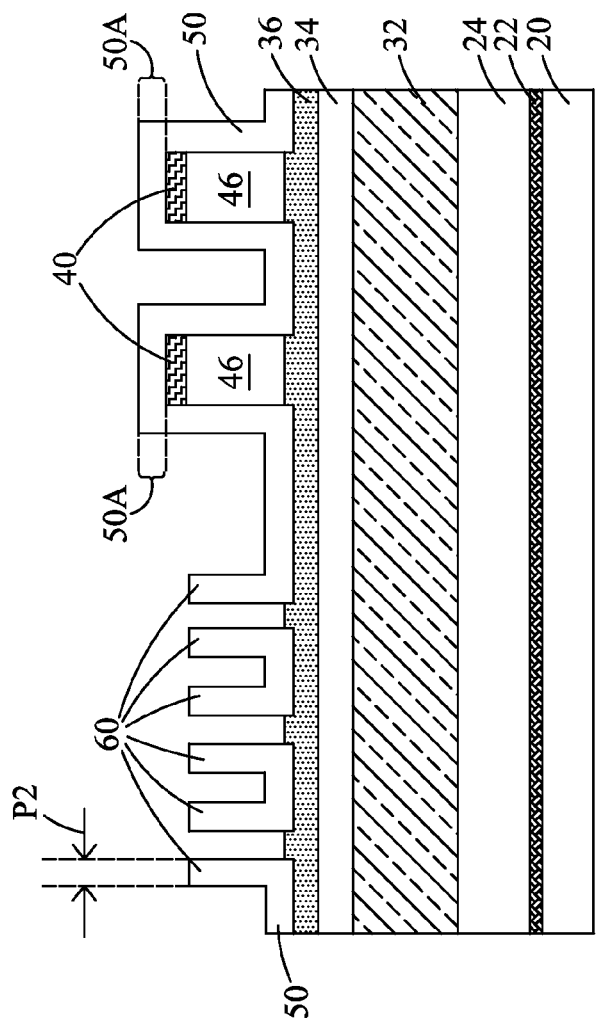

FIGS. 4 and 5 illustrate a second lithography process for patterning spacer layer 50. Referring to FIG. 4, bottom layer 54 is formed over spacer layer 50. Bottom layer 54 may contain a polar component such as a polymer with hydroxyl or phenol groups. In an embodiment, bottom layer 54 comprises an i-line photo resist. Alternatively, bottom layer 54 comprises a deep Ultra-Violet (UV) photo resist including polymers having hydroxystyrene groups. Middle layer 56 is then formed over bottom layer 54. Middle layer 56 may be formed of an oxide-like photo resist. Bottom layer 54 and middle layer 56 may be formed using spin-on coating. Followed by the formation of middle layer 56, photo resist 58 is formed and patterned.

Middle layer 56 and bottom layer 54 are patterned according to the pattern of photo resist 58, and hence the structure in FIG. 5 is formed. In an exemplary process for forming the structure in FIG. 5, portions of middle layer 56 and bottom layer 54 that are not covered by photo resist 58 are etched first, until top portions 50A (please refer to FIG. 4) of spacer layer 50 are exposed. Top portions 50A are located over and aligned to mandrels 46. At this time, portions 54A (FIG. 4) of bottom layer 54 still remain. Next, top portions 50A and silicon oxynitride layer 40 are etched, until mandrels 46 are exposed. The remaining portions 54A of bottom layer 54 and mandrels 46 are then removed, for example, using plasma-assisted ashing. Photo resist 58 and the remaining portions of middle layer 56 and bottom layer 54 are then removed. The resulting structure is shown in FIG. 5. It is appreciated that the above-discussed process for patterning spacer layer 50 is merely an exemplary process, and alternative processes may be used.

In FIG. 5, the remaining portions of spacer layer 50 include some sidewall portions that are on the opposite sidewalls of the mandrels 46 as in FIG. 4. Optionally, some top portions 50A of spacer layer 50 may remain. Throughout the description, the sidewall portions of spacer layer 50 are alternatively referred to as sidewall spacers 60. Pitch P2 sidewall spacers 60 may be as small as a half of pitch P1 of mandrels 46 in FIG. 2.

Figure 6:
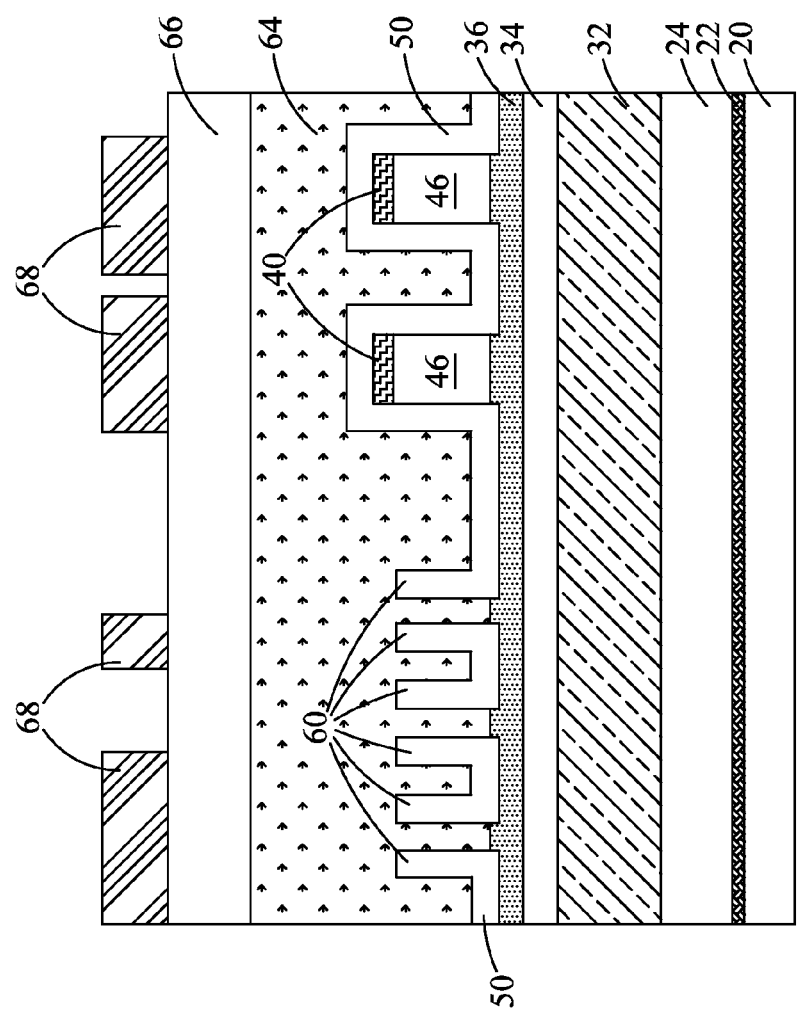
Figure 7:
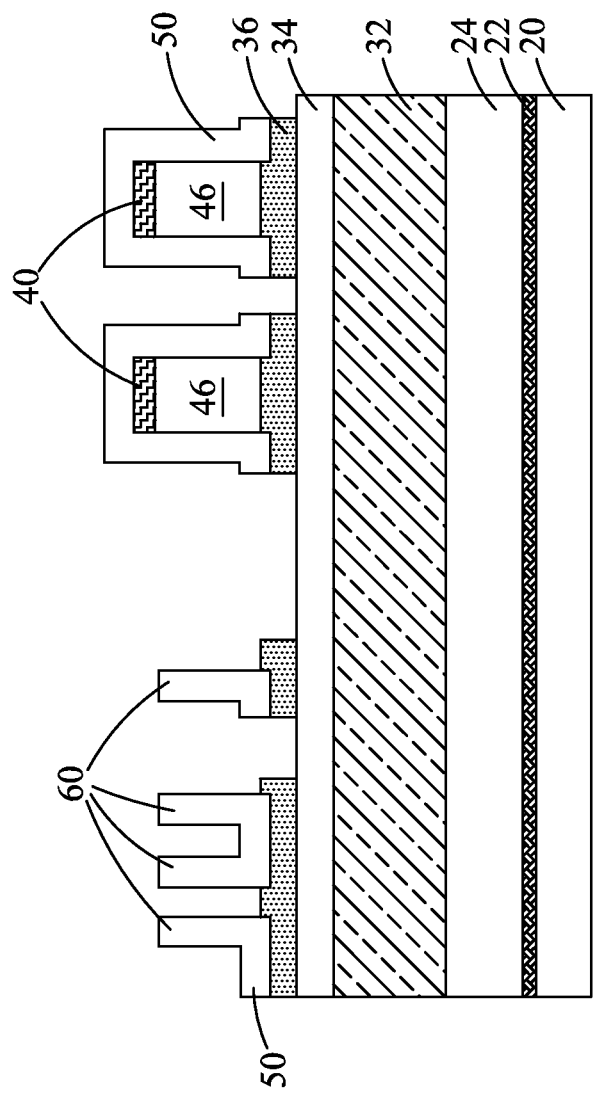

FIGS. 6 and 7 illustrate a third lithography process for further patterning spacer layer 50. In FIG. 6, bottom layer 64 and middle layer 66 are formed, followed by the formation of photo resist 68. Bottom layer 64 may be formed of a material selected from the same group of materials for forming bottom layer 54. Middle layer 66 may also be formed of a material selected from the same group of materials for forming middle layer 56. In some embodiments, bottom layer 64 and middle layer 66 are formed of the same materials as bottom layer 54 and middle layer 56, respectively.

Next, as shown in FIG. 7, photo resist 68 is used as an etching mask to remove some of sidewall spacers 60, while some other sidewall spacers 60 remain not removed. Bottom layer 64, middle layer 66, and photo resist 68 are then removed.

Figure 8:
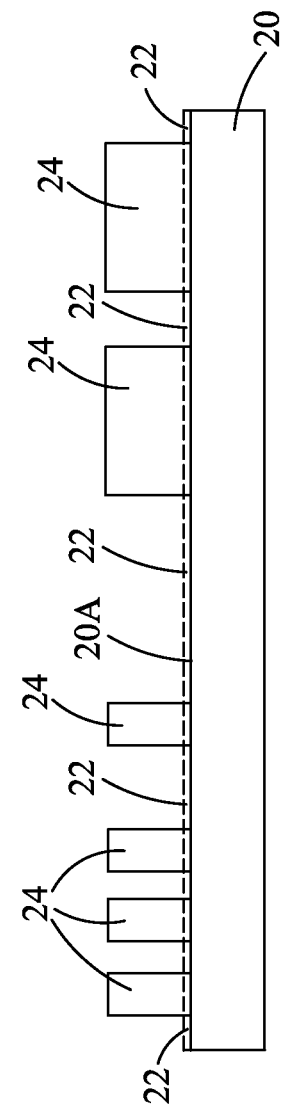

In subsequent steps, sidewall spacers 60 and the remaining portions of spacer layer 50 are used as an etching mask to perform patterning. During the patterning, the underlying silicon oxynitride layer 36, PE oxide layer 34, ARD layer 32, hard mask 24, and pad oxide 22 are patterned. Accordingly, the pattern of sidewall spacers 60 and the remaining portions of spacer layer 50 is transferred into hard mask 24 and pad oxide 22. The remaining portions of silicon oxynitride layer 36, PE oxide layer 34, and ARD layer 32 are then removed. FIG. 8 illustrates the resulting structure. In some embodiments, portions of top surface 20A of substrate 20 may be exposed through the remaining hard mask 24 and pad oxide 22. In alternative embodiments, the exposed portions of pad oxide layer 22 may be left un-etched, as illustrated by dashed lines, which represent the top surfaces of the remaining pad oxide layer 22.

Figure 9:
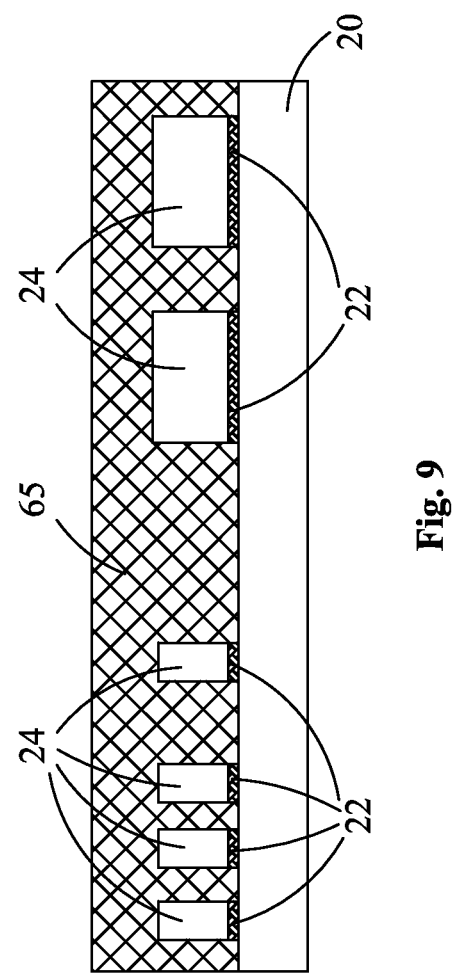

Referring to FIG. 9, dielectric material 65 is filled into the spaces between hard mask portions 24 and pad oxide 22. The top surface of dielectric material 65 may be higher than the top surface of hard mask portions 24. In accordance with some embodiments, dielectric material 65 is filled by spin-on coating. A curing process, such as thermal curing process, is then performed to cure dielectric material 65. In some embodiments, dielectric material 65 comprises silicon oxide.

Figure 10:
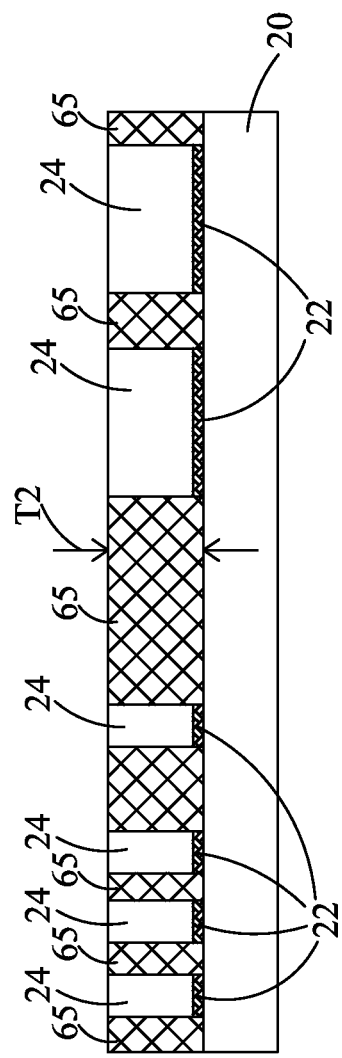

FIG. 10 illustrates a planarization step. In an embodiment, a Chemical Mechanical Polish (CMP) is performed to remove excess portions of dielectric material 65, so that the top surfaces of the remaining dielectric material 65 are level with the top surfaces of hard mask portions 24. An anneal step may then be performed on the structure in FIG. 10. In an exemplary anneal process, the annealing temperature is between about 650° C. and about 1,100° C., and the annealing duration is between about 30 minutes and about 120 minutes. The resulting dielectric material 65 is alternatively referred to as isolation regions 65 or STI regions 65 hereinafter.

Figure 11:
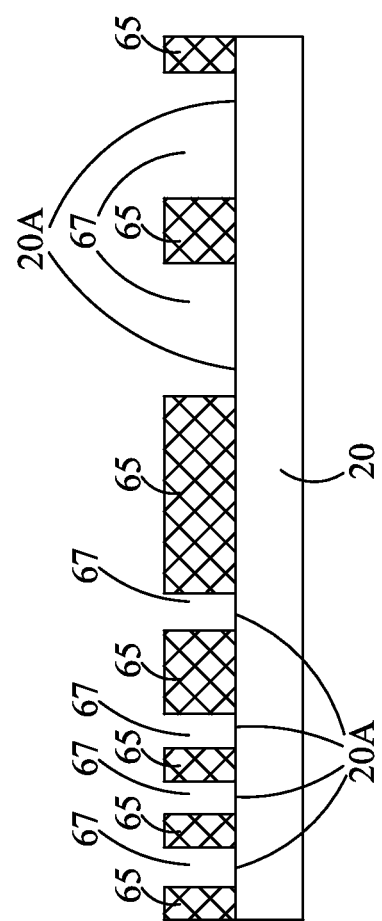

FIG. 11 illustrates the removal of remaining hard mask portions 24 and the underlying portions of pad oxide layer 22. Accordingly, trenches 67 are formed between STI regions 65. Top surface 20A of semiconductor substrate 20 are exposed through STI regions 65.

Figure 12:
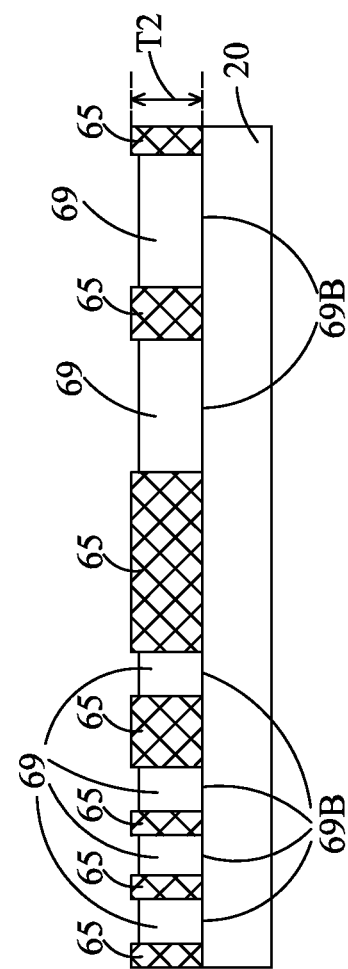

Referring to FIG. 12, an epitaxy is performed to grow epitaxy regions 69 in trenches 67, wherein the epitaxy is started from substrate 20. In some embodiments, the epitaxy is selective, and no epitaxy regions are grown from STI regions 65. Epitaxy regions 69 may comprise crystalline silicon, crystalline silicon germanium, III-V compound semiconductor materials, silicon carbon, or the like. Epitaxy regions 69 may include essentially the same material as underlying substrate 20. For example, when substrate 20 is a crystalline silicon substrate, epitaxy regions 69 may also be crystalline silicon regions. It is noted that even if epitaxy regions 69 and substrate 20 are formed of a same material, noticeable interfaces 69B may be formed between epitaxy regions 69 and substrate 20. In the resulting structure, epitaxy regions 69 act as the active regions, while STI regions 65 define the boundaries of active regions 69. The top surface of epitaxy regions 69 may be substantially level with, or slightly lower than, the top surfaces of STI regions 65. Alternatively, the top surfaces of epitaxy regions 69 may be lower than the top surfaces of STI regions 65.

Figure 13:
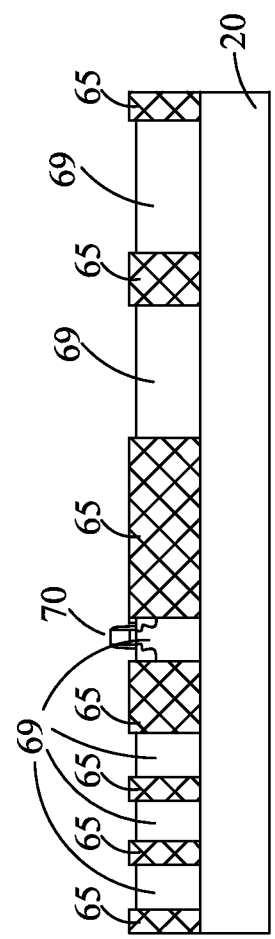

The structure shown in FIG. 12 may then be used to form active devices. For example, planar transistors, Fin Field-Effect Transistors (FinFETs), diodes, or the like, may be formed on active regions 69. FIG. 13 illustrates an exemplary planar transistor 70. It is realized that the structures in accordance with embodiments may be used to form FinFETs. For example, an etch step may be performed to recess the top surfaces of STI regions 65, until the top surfaces of STI regions 65 are lower than the top surfaces of active regions 69. The portions of active regions 69 over the top surfaces of STI regions 65 are the fins, on which the FinFETs may be formed.

In the embodiments, the STI regions are not formed by etching a substrate to form trenches, and filling the trenches to form STI regions. Instead, a reversed-tone method is used, wherein the patterns of active regions are defined first by forming STI regions, and then an epitaxy is performed to grow the active regions. Experiment results indicated that by using the methods in accordance with embodiments, the large-area STI regions and small-area STI regions on a same chip or a same wafer have more uniform thicknesses. In addition, several process steps in the existing process may be omitted. For example, the In-Situ Steam Generation (ISSG) step, which was used to eliminate the surface silicon layer that is adversely affected by the pad oxide removal and hard mask removal process, may be omitted. The active regions formed in accordance with embodiments have a high quality.

In accordance with embodiments, a method includes forming a hard mask over a substrate, patterning the hard mask to form a first plurality of trenches, and filling a dielectric material into the first plurality of trenches to form a plurality of dielectric regions. The hard mask is removed from between the plurality of dielectric regions, wherein a second plurality of trenches is left by the removed hard mask. An epitaxy step is performed to grow a semiconductor material in the second plurality of trenches.

In accordance with other embodiments, a method includes forming a pad oxide layer over a semiconductor substrate, forming a hard mask over the pad oxide layer, forming a mandrel layer over the hard mask, performing a first lithography process to pattern the mandrel layer and to form a plurality of mandrels, and forming a spacer layer. The spacer layer comprises top portions over the mandrels, and sidewall portions on sidewalls of the mandrels. The spacer layer is patterned to leave the sidewall portions of the spacer layer. The hard mask and the pad oxide layer are etched to form hard mask patterns and pad oxide patterns, wherein the step of etching is performed using the sidewall portions of the spacer layer as an etching mask. The sidewall portions of the spacer layer are then removed. The spaces between the hard mask patterns and the pad oxide patterns are filled with a dielectric material. The hard mask patterns and the pad oxide patterns are removed. An epitaxy step is performed to grow a semiconductor material in the spaces left by the removed hard mask patterns and the pad oxide patterns.

In accordance with yet other embodiments, a method includes forming dielectric patterns on a top surface of a semiconductor substrate, wherein portions of the semiconductor substrate are exposed through spaces between the dielectric patterns. An epitaxy is performed to grow epitaxy regions in the spaces, wherein the epitaxy regions are grown from the semiconductor substrate. The epitaxy regions and the semiconductor substrate are formed of essentially a same semiconductor material.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
forming dielectric patterns on a top surface of a semiconductor substrate, wherein portions of the semiconductor substrate are exposed through spaces between the dielectric patterns;
performing an epitaxy to grow epitaxy regions in the spaces, wherein the epitaxy regions are grown from the semiconductor substrate, and wherein the epitaxy regions and the semiconductor substrate are formed of essentially a same semiconductor material, with the epitaxy regions having respective top surfaces no higher than top surfaces of the dielectric patterns; and
forming a transistor at one of the top surfaces of the epitaxy regions.

2. The method of claim 1, wherein the semiconductor substrate is a crystalline silicon substrate, and wherein the epitaxy regions are crystalline silicon regions.

3. The method of claim 1, wherein the step of forming the dielectric patterns comprises:
forming hard mask patterns over the semiconductor substrate;
filling spaces between the hard mask patterns with a dielectric material; and
performing a planarization to level top surfaces of the dielectric material with top surfaces of the hard mask patterns, wherein remaining portions of the dielectric material after the planarization form the dielectric patterns.

4. The method of claim 3, wherein the step of forming the hard mask patterns comprises:
forming a hard mask over the semiconductor substrate;
forming a mandrel layer over the hard mask;
performing a first lithography process to pattern the mandrel layer and to form a plurality of mandrels;
forming a spacer layer, wherein the spacer layer comprises top portions over the mandrels, and sidewall portions on sidewalls of the mandrels;
patterning the spacer layer to leave at least some sidewall portions of the spacer layer; and
etching the hard mask using remaining portions of the spacer layer as an etching mask to form the hard mask patterns.

5. The method of claim 3, wherein the hard mask patterns comprises polysilicon.

6. The method of claim 3 wherein the forming hard mask patterns comprises:
forming a hard mask over the semiconductor substrate;
forming a first mandrel and a second mandrel over the hard mask;
forming a spacer layer comprising:
a first top portion and a second top portion over the first mandrel and the second mandrel, respectively; and
a first sidewall portion and a second sidewall portion on a sidewall of the first mandrel and a sidewall of the second mandrel, respectively;
performing an etch step to remove the first top portion, wherein the second top portion, the first sidewall portion, and the second sidewall portion remain after the etch step; and
etching the hard mask using the second top portion, the first sidewall portion, and the second sidewall portion as an etching mask to form the hard mask patterns.

7. A method comprising:
forming a blanket dielectric layer on a top surface of a semiconductor substrate;

etching the blanket dielectric layer to form a plurality of patterned dielectric regions;

filling spaces between the patterned dielectric regions to form Shallow Trench Isolation (STI) regions, with the STI regions coplanar with the plurality of patterned dielectric regions;

removing the plurality of patterned dielectric regions to reveal the top surface of the semiconductor substrate; and epitaxially growing a semiconductor material in spaces left by the removed plurality of patterned dielectric regions.

8. The method of claim 7, wherein after the etching the blanket dielectric layer, the top surface of the semiconductor substrate is exposed to spaces between the plurality of patterned dielectric regions.

9. The method of claim 7, wherein the epitaxially growing the semiconductor material is stopped before the top surface of the semiconductor material is higher than top surfaces of the STI regions.

10. The method of claim 7, wherein the blanket dielectric layer comprises an oxide layer, and a hard mask layer over the oxide layer, wherein the oxide layer and the hard mask layer are formed of different materials.

11. The method of claim 10, wherein in the etching the blanket dielectric layer to form the plurality of patterned dielectric regions, the hard mask layer is etched, and the oxide layer remains after the etching.

12. The method of claim 10, wherein in the etching the blanket dielectric layer to form the plurality of patterned dielectric regions, both the hard mask layer and the oxide layer are etched.

13. The method of claim 7, wherein the semiconductor material and the semiconductor substrate are formed of essentially a same material.

14. The method of claim 7, wherein the etching the blanket dielectric layer comprises:

forming a first mandrel and a second mandrel over the blanket dielectric layer;

forming a spacer layer comprising:

a first top portion and a second top portion over the first mandrel and the second mandrel, respectively; and a first sidewall portion and a second sidewall portion on a sidewall of the first mandrel and a sidewall of the second mandrel, respectively; and performing an etch step to remove the first top portion, with the second top portion, the first sidewall portion, and the second sidewall portion remaining, wherein the blanket dielectric layer is etched using the second top portion, the first sidewall portion, and the second sidewall portion as an etching mask.

15. A method comprising:

forming a pad oxide layer over a top surface of a semiconductor substrate;

forming a hard mask layer over the pad oxide layer;

etching the hard mask layer to form a plurality of hard mask patterns;

filling spaces left by etched portions of the etched hard mask layer to form Shallow Trench Isolation (STI) regions;

performing a planarization to level top surfaces of the STI regions with a top surface of the plurality of hard mask patterns;

removing the hard mask patterns to expose the top surface of the semiconductor substrate; and epitaxially growing a semiconductor material from the exposed top surface of the semiconductor substrate.

16. The method of claim 15, wherein after the plurality of hard mask patterns is formed, the hard mask layer is etched, and the pad oxide layer remains after the etching.

17. The method of claim 15, wherein after the plurality of hard mask patterns is formed, both the hard mask layer and the pad oxide layer are etched.

18. The method of claim 15, wherein the epitaxially growing the semiconductor material is stopped before a top surface of the semiconductor material is higher than top surfaces of the STI regions, and the semiconductor material and the semiconductor substrate are formed of essentially a same semiconductor material.

19. The method of claim 15, wherein the exposed top surface of the semiconductor substrate is substantially coplanar with a bottom surface of the pad oxide layer.

20. The method of claim 15 further comprising forming a transistor at a top surface of the semiconductor material.

* * * * *